(12) United States Patent
Findeklee

(10) Patent No.: US 7,239,139 B2
(45) Date of Patent: Jul. 3, 2007

(54) RF COIL SYSTEM FOR A MAGNETIC RESONANCE IMAGING APPARATUS

(75) Inventor: Christian Findeklee, Norderstedt (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 151 days.

(21) Appl. No.: 10/536,286

(22) PCT Filed: Nov. 26, 2003

(86) PCT No.: PCT/IB03/05421

§ 371 (c)(1),
(2), (4) Date: May 25, 2005

(87) PCT Pub. No.: WO2004/048990

PCT Pub. Date: Jun. 10, 2004

(65) Prior Publication Data
US 2006/0038564 A1    Feb. 23, 2006

(30) Foreign Application Priority Data
Dec. 27, 2002   (DE) ............................. 102 55 261

(51) Int. Cl.
G01V 3/00   (2006.01)
(52) U.S. Cl. .......................... 324/318; 324/322
(58) Field of Classification Search .............. 324/318, 324/319, 322, 312, 314, 309, 300, 307; 600/410–422
See application file for complete search history.

(56) References Cited

U.S. PATENT DOCUMENTS

| | | | |
|---|---|---|---|
| 4,987,604 A * | 1/1991 | Rouch | 382/151 |
| 5,548,218 A | 8/1996 | Lu | |
| 5,557,247 A | 9/1996 | Vaughn | |
| 5,666,055 A | 9/1997 | Jones | |
| 5,677,629 A * | 10/1997 | Borsboom | 324/318 |
| 5,689,188 A * | 11/1997 | Claasen-Vujcic | 324/318 |
| 6,150,816 A | 11/2000 | Srinivasan | |
| 6,538,441 B1 * | 3/2003 | Watkins et al. | 324/318 |
| 6,633,161 B1 * | 10/2003 | Vaughan, Jr. | 324/318 |

(Continued)

OTHER PUBLICATIONS

Duerr, W., et al.; Transmission Line Antennas for Nuclear Magnetic Resonance Imaging, Part 2: Antenna Optimization; 1990; AEU; 44:4:336-343.
Lee, Ray F.; Planar Strip Array (PSA) for MRI; 2001; 45:673-683.

(Continued)

Primary Examiner—Brij B. Shrivastav

(57) ABSTRACT

A device for the transmission and/or reception of RF signals for magnetic resonance imaging (RF coil system) is constructed as an RF coil (body coil) which is permanently mounted in a magnetic resonance imaging apparatus or as a so-called dedicated RF coil (that is, as a separate RF coil which is to be arranged on or around a region to be examined, for example, a head coil, a shoulder coil, a flexible surface coil etc.). A magnetic resonance imaging apparatus includes an RF coil system of this kind. The RF coil system includes a plurality of resonant conductor elements (201, 202, ..., 208; 211, 212, ..., 218), notably □/4 monopole elements. In comparison with known RF coil systems of the same length, a substantially larger field of view as well as a constant variation and a steeper drop of the field characteristic are thus achieved at the edges of the RF coil system while the construction remains comparatively simple and economical nevertheless.

18 Claims, 6 Drawing Sheets

U.S. PATENT DOCUMENTS

| | | | |
|---|---|---|---|
| 6,714,013 B2 * | 3/2004 | Misic | 324/318 |
| 6,806,710 B1 | 10/2004 | Renz | |
| 6,822,448 B2 * | 11/2004 | Watkins et al. | 324/318 |
| 6,995,561 B2 * | 2/2006 | Boskamp et al. | 324/318 |

OTHER PUBLICATIONS

Vaughan, J.T., et al.; High Frequency Volume Coils for Clinical NMR Imaging and Spectroscopy; 1994; MRM; 32:206-218.

Wen, Han, et al.; The Design and Test of a New Volume Coil for High Field Imaging; 1994; MRM; 32:492-498.

* cited by examiner

RF COIL SYSTEM FOR A MAGNETIC RESONANCE IMAGING APPARATUS

BACKGROUND

The invention relates to a device for the transmission and/or reception of RF signals for magnetic resonance imaging (referred hereinafter in general as an "RF coil system") which is constructed as an RF coil which is permanently mounted in a magnetic resonance imaging apparatus (body coil) or as a so-called dedicated RF coil (that is, as a separate RF coil which is to be arranged on or around a region to be examined, for example, a head coil, a shoulder coil, a flexible surface coil etc.), as well as to a magnetic resonance imaging apparatus provided with such an RF coil system.

Magnetic resonance (MR) imaging apparatus is used notably for the examination and treatment of patients. The nuclear spins of the tissue to be examined, aligned by a steady main magnetic field ($B_0$ field) are then excited by a pulse-like $B_1$ field which is orthogonal to the main magnetic field and has the MR or Larmor frequency. Moreover, for localization the nuclear spins are also subjected to gradient magnetic fields. The RF relaxation signals induced by the excitation are received and evaluated in order to reconstruct an image of the relevant tissue therefrom in known manner.

Essentially two types of construction can be distinguished: on the one hand there are the so-called axial systems in which the patient is introduced into an essentially horizontally oriented tubular examination zone. The magnetic fields are generated by magnet coils which are arranged along the circumference of the examination zone, the main magnetic field then traversing the patient in the direction of the longitudinal axis of the patient.

On the other hand, there are the so-called open MR imaging apparatus (vertical systems) in which the main magnetic field is generated, generally speaking, between two pole plates which are arranged one above the other and wherebetween a vertical cylindrical examination zone for a patient is defined. The main magnetic field ($B_0$ field) traverses the patient essentially in a direction perpendicular to the longitudinal axis of the patient (that is, vertically). The patient then remains suitably accessible from almost all sides, that is, even during the imaging, so that interventional examinations can also be performed.

RF coil systems are permanently mounted in said systems (so-called RF body coils) in order to generate the $B_1$ field (RF field) and to receive the RF relaxation signals; the configuration and positioning of such coils has a decisive effect on the image quality, notably the signal-to-noise ratio and the resolution.

Moreover, dedicated (separate) RF coils such as, for example, head coils, shoulder coils etc., are also used; these coils are also known as at least partly flexible surface coils or pads and can be arranged around or on the region of a patient to be examined.

In this respect it is very important that the overall examination zone to be imaged is traversed by an as homogeneous as possible RF field or that the reception characteristic of the RF coil system is as constant as possible in this zone. Furthermore, the field of view (FOV) of the RF coil system should extend as accurately as possible across the space of the at least substantially constant $B_0$ field and the useful space of the gradient coils, generating the gradient magnetic fields, so that the resultant, defined useful examination zone (and only this zone) is exposed as completely and constantly as possible so as to be used for disturbance-free imaging.

For example, U.S. Pat. No. 6,150,816 discloses an RF coil system which includes at least a first, a second and a third RF coil which are electrically insulated from one another, can be separately activated and are arranged so as to overlap one another in the axial direction in such a manner that no magnetic coupling exists therebetween. The aim is to provide not only an improved signal-to-noise ratio but also an expanded and switchable field of view of the RF coil system.

However, this system has the drawback that the length of this coil system in the axial direction is comparatively large in comparison with the length of the field of view in this direction, that is, in particular when an as constant as possible variation and a steep drop of the RF field or the reception characteristic are desired at the axial ends of the field of view.

SUMMARY

Therefore, it is a general object of the invention to provide a device for generating $B_1$ fields and/or for receiving RF relaxation signals (customarily referred to as an RF coil system) whereby a useful examination zone can be exposed with a field of view which is constant to a high degree in respect of the transmission or reception characteristic (field characteristic).

It is notably an object of the invention to provide an RF coil system of the kind set forth for an MR imaging apparatus in the form of an axial system whereby a field characteristic can be generated which is adapted to the dimension of the at least substantially constant $B_0$ field in the axial direction and to the gradient magnetic fields and which decreases comparatively steeply at the axial ends while utilizing a comparatively small dimension of the RF coil system in this direction.

Finally, it is also an object of the invention to provide an RF coil system of the kind set forth for an MR imaging apparatus in the form of a vertical system whereby a field characteristic can be obtained which is adapted to the dimension of the at least substantially constant $B_0$ field in the radial direction of the examination zone and to the gradient magnetic fields and which decreases comparatively steeply at the radial ends.

The object is achieved by means of a device for the transmission and/or reception of RF signals for magnetic resonance imaging (RF coil system) which is formed by a plurality of resonant conductor elements.

This RF coil system thus constitutes essentially a wave resonator. A special advantage of this solution resides in the fact that in an axial system the ratio of the dimension of the field of view in the direction of the axis of the RF coil system to the axial length of this RF coil system can thus be increased by approximately the factor 2.

Moreover, according to this solution not only RF coils which are permanently mounted in the system can be realized, but also the previously mentioned dedicated RF coils.

A further advantage of this solution is that in comparison with known RF coil systems it can be constructed in a comparatively simple and economical manner.

One embodiment offers the advantage that the tuning to the MR frequency of a tissue to be examined can be performed in a simple manner. The resonance frequency of the RF coil system depends on the respective distance of the resonant conductor elements to each other and/or to their distance to the shield.

In an embodiment, the RF coil system is intended to be mounted permanently in an axial system or is intended for the use as an RF volume coil; whereas, another embodiment is intended for a vertical system or an RF surface coil. Of course, the various embodiments could be combined.

Advantages of the present application will be apparent to those of ordinary skill in the art upon reading and understanding the following detailed description.

BRIEF DESCRIPTION OF THE DRAWINGS

Further details, characteristics and advantages of the invention will become apparent from the following description of preferred embodiments which is given with reference to the drawing. Therein.

DETAILED DESCRIPTION

Figure 1:
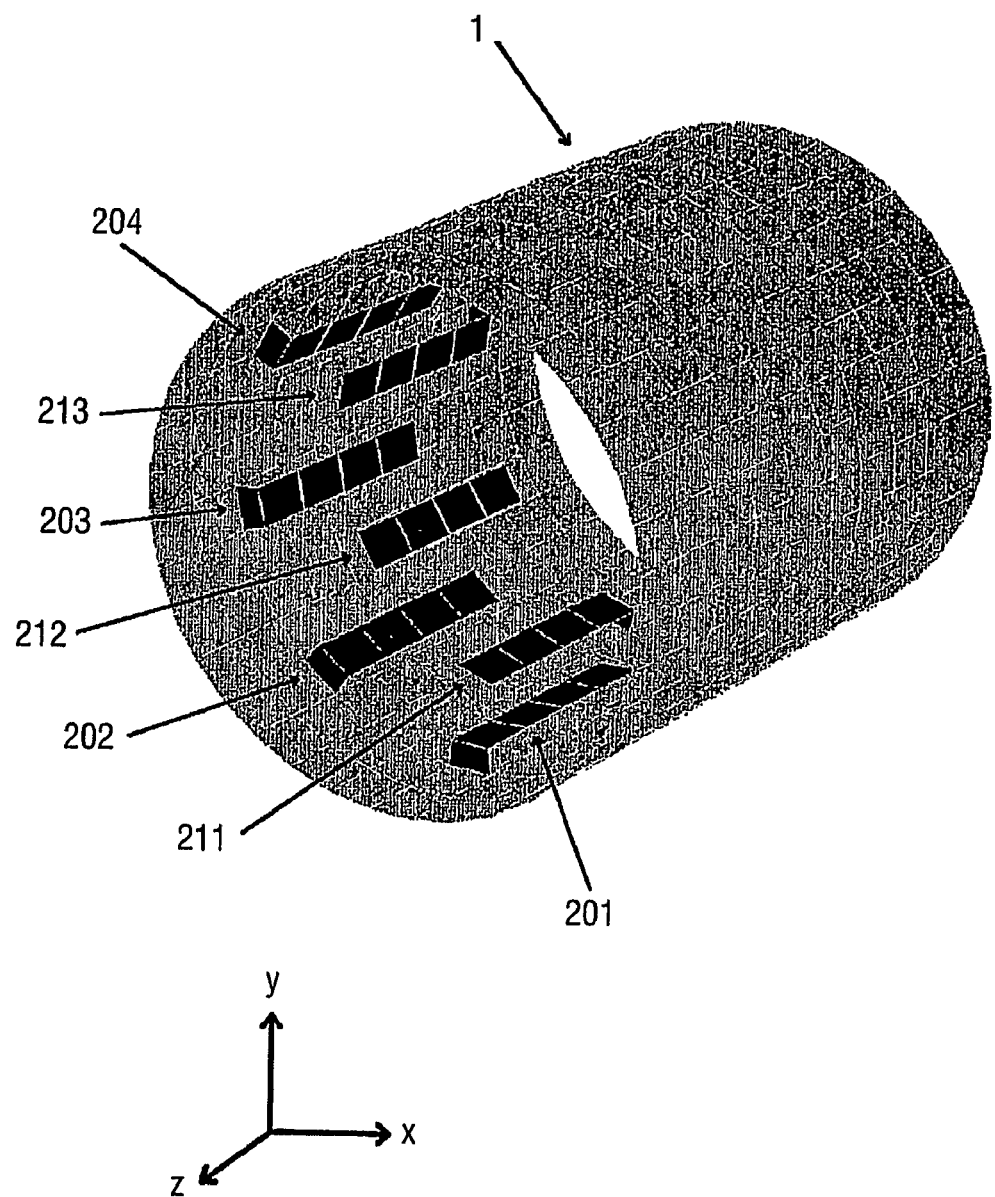
FIG. 1 is a diagrammatic three-dimensional representation of a body coil with a first RF coil system in accordance with the invention.

FIG. 1 is a diagrammatic representation of a quadrature body coil (QBC) which comprises an external RF shield 1 of an electrically conductive material.

On the inner circumference of the RF shield 1 there is provided a first embodiment of an RF coil system in accordance with the invention. This RF coil system comprises a first group of conductor elements 201, 202, 203, . . . which are distributed along the circumference as well as a second group of conductor elements 211, 212, 213, . . . which are also distributed along the circumference. All conductor elements extend in the axial direction of the examination zone (z direction) and have the same length. The conductor elements of a group are situated essentially at the same level in the z direction.

In order to realize a given field characteristic, however, the conductor elements may also have a different length and/or be situated at a different level in the z direction.

The two groups of conductor elements are arranged so as to be offset relative to one another in the z direction, so that, viewed in the circumferential direction of the examination zone, the conductor elements partly overlap one another and hence are coupled to one another. Viewed in the circumferential direction, the conductor elements 201, 202, . . . ; 211, 212, . . . then belong alternately to the first group and the second group. Granted, a coupling between the conductors also occurs in the absence of mutual overlapping, but in that case the field characteristic possibly is not as uniform as it is now.

The electrically effective length of the circumference on which the conductor elements 201, 202, . . . ; 211, 212, . . . are situated, which length is determined by the dielectric constant of the surrounding materials (for example, the tuning structure and the patient shielding as described hereinafter), is proportioned so that it corresponds approximately to the wavelength λ of the RF frequency (Larmor frequency).

For the use of the RF coil system at low frequencies, furthermore, a further dielectric structure may be added so as to reduce its electrical length for a given circumference.

The length of the conductor elements 201, 202, . . . ; 211, 212, . . . is proportioned to be such that these elements are resonant at the RF frequency and hence, as opposed to known RF coil systems, a non-constant current distribution occurs along the conductor elements 201, 202, . . . ; 211, 212, . . . .

Each of the conductor elements 201, 202, . . . ; 211, 212, . . . is formed by a resonant conductor and preferably a monopole element of a metallic foil having a length of λ/4. The ends of the monopole elements which are situated at the area of overlap of the two groups are open, whereas the oppositely situated (that is, the axially outer) ends of the monopole elements are coupled to the RF shield 1.

The axially inner ends of the monopole elements can also be connected to the RF shield 1 via capacitors in order to reduce their electrical length, so that the current does not drop to the value zero in these regions. The variation of the field characteristic of the RF coil system in these regions can thus be more suitably adapted to the variation in the axially outer regions.

Figure 2:
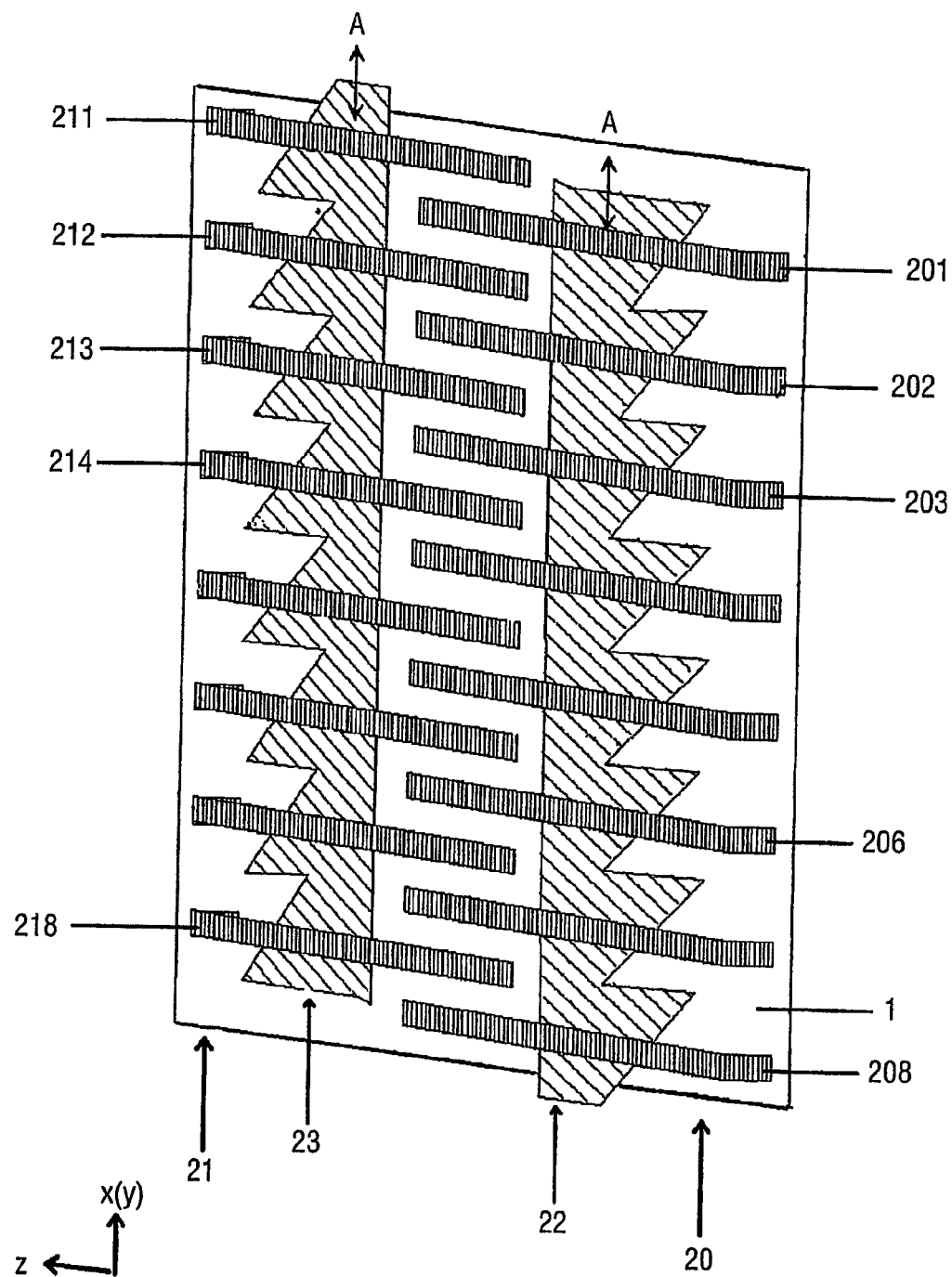
FIG. 2 is a plan view of the circumference of the body coil from the inside.

FIG. 2 is a plan view of the RF shield 1 in an unrolled state, that is, from within the examination zone. The two partly overlapping groups 20, 21 of monopole elements 201, 202, . . . , 208 and 211, 212, . . . , 218 can again be recognized in this representation.

The RF coil system can be tuned to the Larmor frequency of the tissue examined by moving the monopole elements 201, 202, . . . , 208 in z-direction and the monopole elements 211, 212, . . . , 218 in (−z)-direction which increases the overlapping area of the groups 20, 21 and which decreases the resonance frequency of the RF coil system. Moving the monopole elements 201, 202, . . . , 208 in (−z)-direction and the monopole elements 211, 212, . . . , 218 in z-direction decreases the overlapping area of the groups 20, 21 and increases the resonance frequency. Alternatively or additionally, the tuning to the Larmor frequency can be archived by changing the distance between the monopole elements 201, 202, . . . , 208 and 211, 212, . . . , 218 and the RF shield 1. Increasing the distance results in decreasing the resonance frequency and reversed.

Another possibility of tuning the RF coil system to the Larmor frequency of the tissue examined is described hereafter. In FIG. 2, a tuning structure in the form of a strip-like element 22, 23 (which is closed so as to form a ring in the rolled-up state) of a dielectric material is provided for each group 20, 21; this tuning structure extends essentially perpendicularly to the longitudinal direction of the monopole elements and has a periodically recurrent increased width and/or thickness in conformity with the number of monopole elements 201, 202, 203, . . . , 208 or 211, 212, 213, . . . , 218 in each group 20, 21. In the case shown one side of the element 22, 23 (or of the ring) has the shape of a sawtooth for this purpose.

Furthermore, the elements or rings 22, 23 are arranged in such a manner that (together or independently from one another) they can be displaced (or rotated) in the circumferential direction of the RF shield 1 (in this case in conformity with the arrow A) in such a manner that, in dependence on the position, a segment of the ring 22 or 23 with a smaller or larger width will be situated in the region of each monopole element 201, 202, 203, . . . , 208 or 211, 212, 213, . . . , 218, thus modifying the characteristic impedance of parts of the monopole elements.

The RF coil system can thus be tuned to the Larmor frequency of the tissue examined by rotating the dielectric rings 22, 23 in the circumferential direction.

Figure 3:
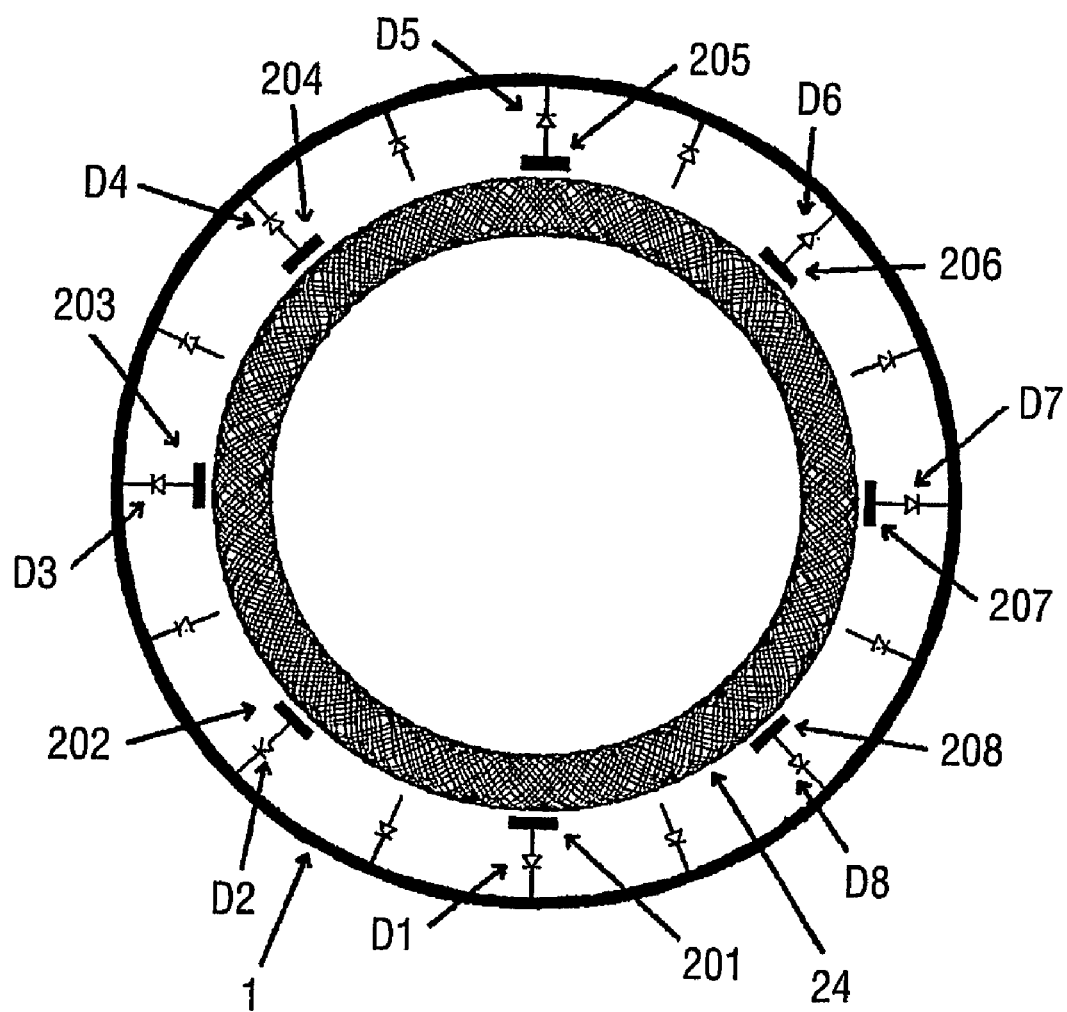
FIG. 3 is a cross-sectional view of the body coil.

FIG. 3 is a cross-sectional view (x/y plane) of the RF coil system shown in FIG. 1. FIG. 3 shows the RF shield 1 as well as the resonant monopole elements 201, 202, ..., 208 of the first group 20. The rings 22, 23 of a dielectric material (tuning structures) are not shown.

FIG. 3 also shows a number of diodes (for example, pin diodes) D1, D2, ..., D8 which are coupled to the RF shield 1 each time via the outer ends of the monopole elements 201, 202, ..., 208 in the axial direction of the examination zone. The oppositely situated free ends of the monopole elements 201, 202, ..., 208 are connected to one another via inductances, for example, choke coils (not shown) which constitute a very high impedance for RF signals.

The diodes D1, D2, ..., D8 can thus be rendered conductive or be blocked by application of a bias voltage between the RF shield 1 and the free ends of the monopole elements 201, 202, ..., 208 which are connected via the choke coils. In the conductive state the monopole elements 201, 202, ..., 208 are connected to the RF shield 1 via the diodes D1, D2, ..., D8, so that the RF coil system operates in the described manner. When the diodes D1, D2, ... are blocked by an appropriate change of the bias voltage, the RF coil system is detuned. This makes sense, for example, when different RF coil systems are used for the transmission and the reception and when the RF coil system which is inactive at the moment is to be prevented from disturbing the active RF coil system by resonance or coupling effects.

Finally, in FIG. 3 a further RF shield 24 (patient shield) which surrounds the patient is provided in the examination zone. This prevents the patient from being exposed to the comparatively high electrical field which occurs at the free ends of the monopole elements, so that a high specific absorption rate (SAR) arises.

The shield 24 can also serve as a tuning structure for the RF coil system if it is provided with a periodically recurrent change of cross-section, as described above with reference to the tuning structures 22, 23, and when it is arranged so as to be rotatable.

As has already been stated, the described RF coil system ensures that the current distribution along the conductor elements is not constant but various in a cosine-like fashion because of the resonant length at the RF frequency.

Figure 4:
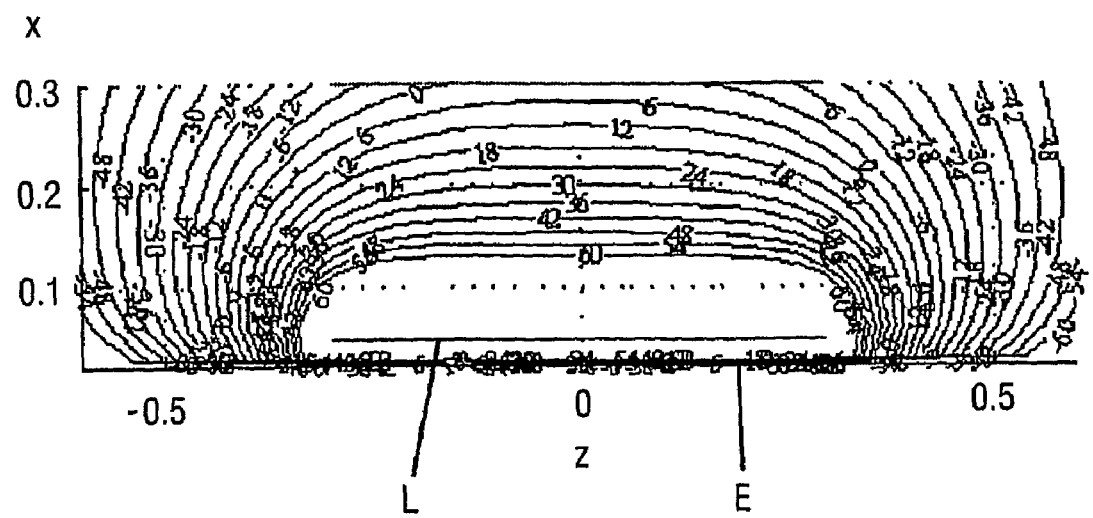
FIG. 4 shows a variation of the magnetic field strength of a conductor over a plane.
Figure 5:
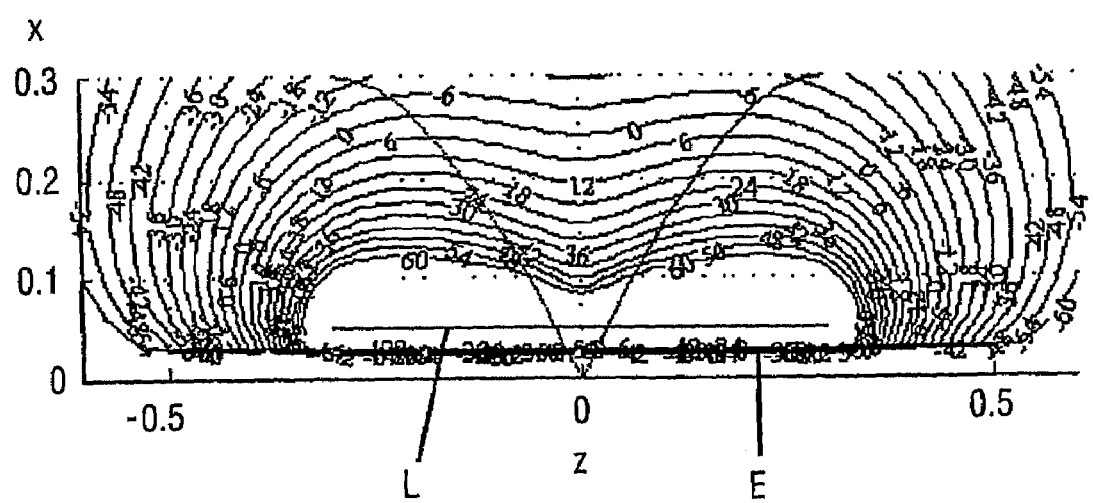
FIG. 5 shows a variation of the magnetic field strength of a conductor over a plane.

FIGS. 4 and 5 illustrate the resultant effect on the variation of the magnetic field strength H. FIG. 4 shows the variation occurring in the case of a conductor L with a constant current distribution which is arranged over a conductive plane E, whereas FIG. 5 shows the variation in the case of a cosine-like current distribution in such a conductor L.

In the case of $\lambda/4$ monopole elements, the current in the monopole elements has a maximum at the ends which are situated in the axial direction and are coupled to the RF shield 1 whereas it drops to a minimum or zero in an essentially cosine-like fashion in the direction of the inner open ends.

The monopole elements of each group 20, 21 are electrically and magnetically coupled to one another and have resonances in different modes of operation. These modes of operation enable a very constant magnetic field to be generated in a plane perpendicular to the axis of the examination zone (x/y plane). These modes of operation are split each time into an even mode and an odd mode of operation as a result of the arrangement of two groups of monopole elements.

In the odd (low) modes of operation the currents flowing in the z direction in neighboring monopole elements have the same phase and exhibit a maximum each time at the (axial) ends situated in the z direction of the RF coil system, so that overall a substantially constant magnetic field variation is obtained in the z direction and the field of view in this direction is significantly larger in comparison with known RF coil systems.

An even steeper drop, and hence a substantially more rectangular variation of the field characteristic in the z direction, can be achieved by the addition of further groups of monopole elements (not shown) at the two axial ends of the RF coil system, that is, if the currents in the monopole elements of the further groups exhibit a phase shift of 180 degrees relative to the currents in the neighboring monopole elements of the first or the second group 20, 21.

Figure 6:
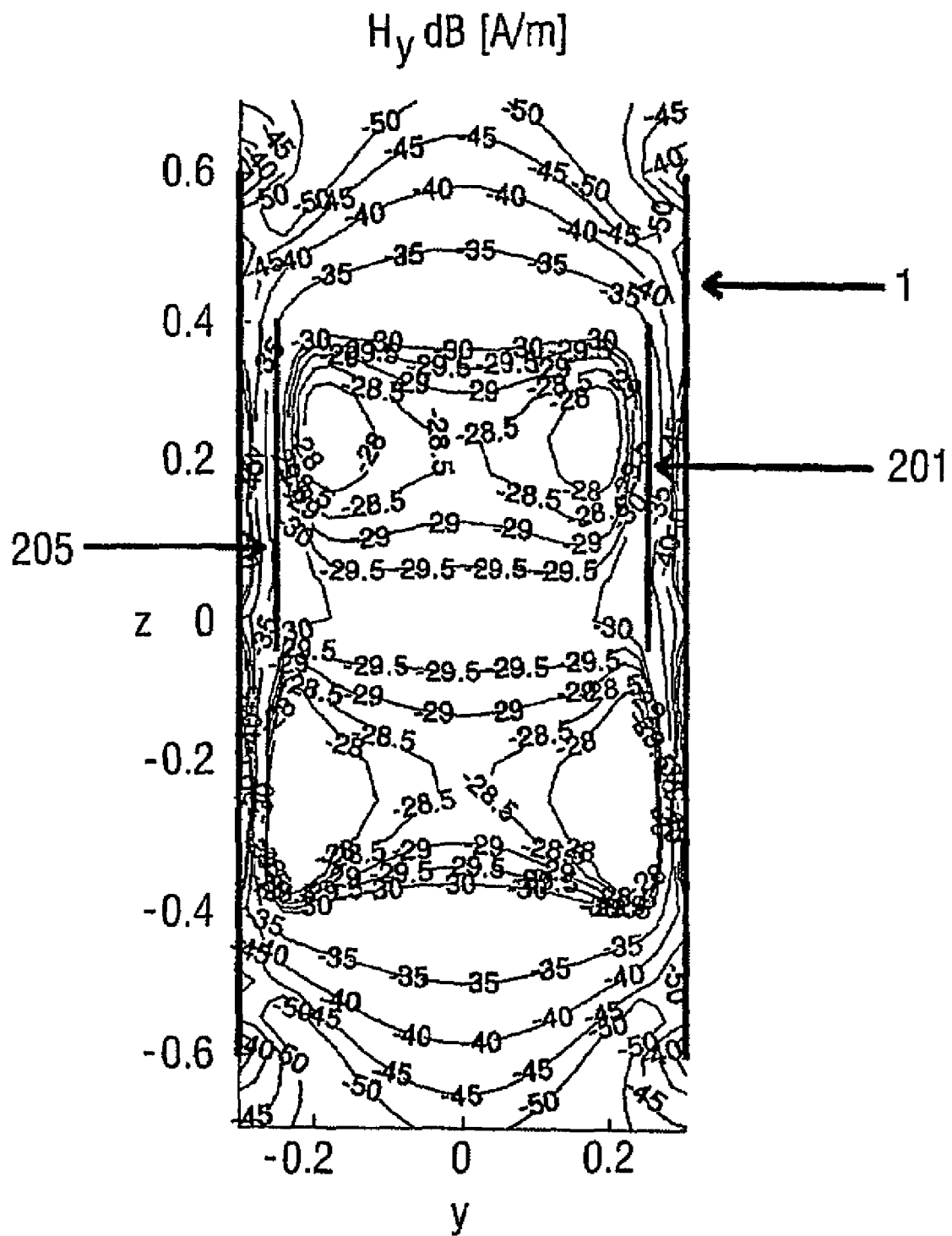
FIG. 6 shows a typical variation of the magnetic field strength in the first RF coil system.

FIG. 6 shows diagrammatically a variation of the magnetic field strength $H_y$, produced by the first RF coil system, within the RF shield 1 in the x/z (or x/z) plane, two of the monopole elements 201, 205 also being shown. In comparison with a known birdcage coil (for example, a head coil), the ratio of the field of view to the coil length can be increased, for example, by approximately the factor 2.

Figure 7:
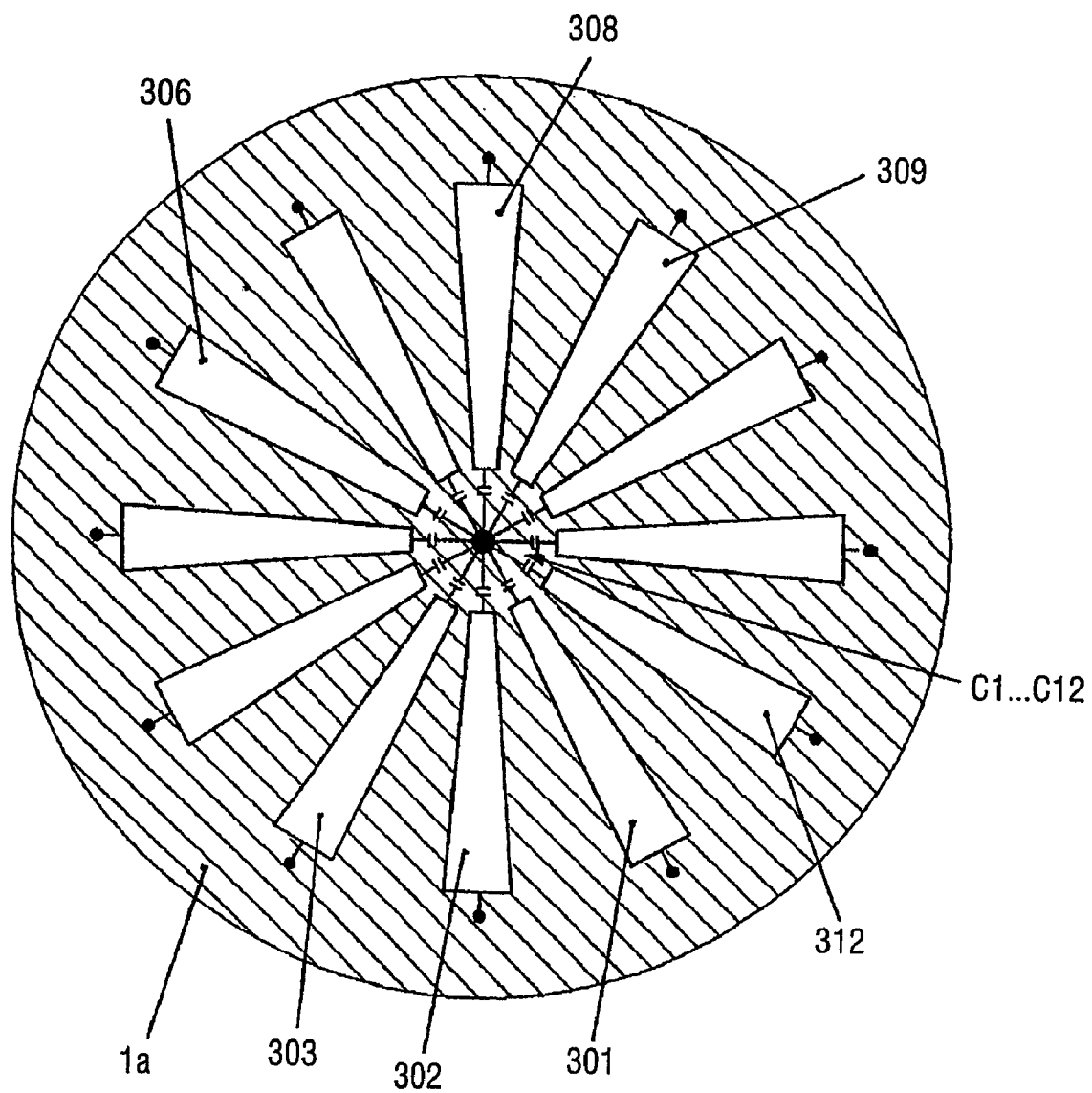
FIG. 7 is a plan view of a second RF coil system for an MR imaging apparatus in the form of a vertical system.

The principle can also be used for the previously described open MR imaging apparatus (vertical systems). FIG. 7 shows a second embodiment of the invention in the form of an RF coil system which is rigidly arranged as a transmission and/or receiving antenna at the area of at least one axial end of the vertical-cylindrical examination zone of the MR imaging apparatus.

This RF coil system is also provided with an RF shield 1a which again serves as a carrier for a group of resonant conductor elements 301, 302, ..., 312. The conductor elements are arranged so as to extend radially from the center of the RF shield 1a. The radial outer ends of the conductor elements 301, 302, ..., 312 are coupled to the RF shield 1a also in this case.

This coupling can again be realized via a respective diode (not shown), the oppositely situated radial inner ends then being connected to one another via inductances which constitute a very high impedance for the RF signals. If necessary, the RF coil system, can be detuned by application of a bias voltage in conformity with the foregoing description.

Furthermore, in conformity with the foregoing description the radial inner ends of the conductor elements 301, 302, ..., 312 are either open or, as indicated in FIG. 7, connected to the RF shield 1a via capacitors C1, C2, ..., C12 in order to reduce their electrical length so that at these areas the current does not drop to the value zero. A field variation can thus be achieved which is more constant in the radial direction.

In this embodiment the conductor elements 301, 302, ..., 312 are preferably $\lambda/4$ monopole elements of a metallic foil again, which elements may become wider in the radially outwards direction. Furthermore, the previous explanations given in relation to the first embodiment of the RF coil system also hold for the operation of this RF coil system.

This RF coil system can be tuned to the Larmor frequency of the tissue examined by moving the conductor elements 301, 302, ..., 312 parallel to their radial extension and/or by changing their distance to the shield 1a.

Furthermore, this embodiment can again be provided with a tuning structure in conformity with the foregoing description, for example, in the form of one or more concentric rings which have a periodically varying width and/or thickness along the circumference and consist of a dielectric material.

In the embodiments the conductor elements may be connected to one another via capacitors which are arranged along the length of the conductor elements in order to modify their coupling and hence adapt the field characteristic of the RF coil system to given requirements.

For the sake of completeness it is to be noted that, in order to generate a circularly polarized magnetic field, in the RF coil systems in accordance with the invention the power supply to a plurality of conductor elements can also take place with suitably phase-shifted RF signals or the received RF signals can be coupled out in a corresponding fashion via such conductor elements.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. An RF coil system comprising:
   a cylindrical shield surrounding an examination zone;
   a first group of resonant conductor elements mounted extending in an axial direction along an inner surface of the cylindrical shield; and
   a second group of resonant conductor elements mounted extending in the axial direction along the inner surface of the cylindrical shield;
   the two groups being arranged so as to be offset relative to one another in the axial direction of the examination zone and the conductor elements being coupled to the RF shield by way of their outer ends in the axial direction.

2. The RF coil system as claimed in claim 1, in which the conductor elements are λ/4 monopole elements.

3. The RF coil system as claimed in claim 1, whereby the conductor elements are arranged so as to be displaceable with regard to their distance to the shield and/or essentially parallel to the axial direction, so that the resonance frequency of the RF coil system can be tuned by displacement of the conductor elements.

4. A dedicated RF coil for use in magnetic resonance imaging, comprising an RF coil system as claimed in claim 1.

5. A magnetic resonance imaging apparatus comprising a horizontal-cylindrical examination zone (axial system) as well as an RF coil system as claimed in claim 1.

6. The RF coil system as claimed in claim 1 wherein the conductors of the first and second groups are interleaved.

7. An RF coil system as claimed in claim 1, wherein inner ends of the conductor elements of the two groups are reactively connected.

8. An RF coil system as claimed in claim 1, further including:
   capactive elements which connect inner ends of the conductor elements with the shield.

9. An RF coil for transmission or reception of RF signals for magnetic resonance comprising:
   an essentially flat RF shield;
   a plurality of resonant conductor elements mounted extending in radial directions from a center of the RF shield, the resonant conductor elements being connected to the RF shield at radially outer ends.

10. A magnetic resonance imaging apparatus, comprising a vertical-cylindrical examination zone (vertical system) as well as an RF coil system as claimed in claim 9.

11. An RF coil system as claimed in claim 9, wherein the resonant conductor elements increase in width from the center to the outer ends.

12. An RF coil system as claimed in claim 9, wherein ends of the resonant conductor elements adjacent the center are reactively interconnected.

13. An RF coil system as claimed in claim 9, further including:
   capacitve elements which connect ends of the conductor elements with the RF shield.

14. An RF coil system as claimed in claim 9, further including:
   means for displacing the conductive elements at least one of radially and closer or further from the shield to tune the RF coil system.

15. A method of tuning an RF coil system installed in a magnetic resonance scanner, which coil system includes a plurality of resonant conductor elements that are RF-coupled to an RF shield by way of one end, have their other end is open and extend generally parallel to the RF shield, the method comprising:
   moving the conductor elements at least one of (a) closer or further from the RF shield and (b) longitudinally relative to each other.

16. The method as claimed in claim 15, wherein the RF shield and the conductor elements are arranged in two interleaved groups of conductor elements extending longitudinally, the method further including:
   adjusting at least the conductor elements of one of the groups relative to the conductor elements of the other.

17. The method as claimed in claim 15, wherein the resonant conductor elements extend radially outward from a center, the method further including:
   adjusting the conductor elements radially.

18. An RF coil system for transmission and/or reception of RF signals for magnetic resonance, comprising:
   a plurality of resonant conductor elements;
   at least one tuning element of a dielectric material which is arranged so as to be displaceable essentially perpendicularly to a longitudinal direction of the conductor elements and has a segment of different width and/or thickness at the area of the conductor elements, so that the resonance frequency of the RF coil system can be tuned by displacement of the tuning element.

* * * * *